United States Patent
Hirano

(10) Patent No.: US 7,353,441 B2
(45) Date of Patent: Apr. 1, 2008

(54) FLIP FLOP CIRCUIT AND APPARATUS USING A FLIP FLOP CIRCUIT

(75) Inventor: Masashi Hirano, Tokyo (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 317 days.

(21) Appl. No.: 11/099,696

(22) Filed: Apr. 6, 2005

(65) Prior Publication Data

US 2005/0229059 A1    Oct. 13, 2005

(30) Foreign Application Priority Data

Apr. 7, 2004    (JP)    ............... 2004-113439

(51) Int. Cl.
G01R 31/28    (2006.01)
(52) U.S. Cl. .................................... 714/726
(58) Field of Classification Search .................. 714/726
See application file for complete search history.

(56) References Cited

U.S. PATENT DOCUMENTS

| 6,181,179 | B1 | 1/2001 | Kanba |
| 6,300,809 | B1 | 10/2001 | Gregor et al. |
| 6,525,565 | B2 * | 2/2003 | Young et al. .................. 326/46 |
| 7,132,854 | B1 * | 11/2006 | Chen et al. .................... 326/46 |
| 2002/0175704 | A1 | 11/2002 | Young et al. |
| 2003/0218488 | A1 | 11/2003 | Parulkar et al. |

FOREIGN PATENT DOCUMENTS

| DE | 102 19 119 | 11/2003 |
| JP | 05-075401 | 3/1993 |
| JP | 05-267998 | 10/1993 |
| JP | 06-160477 | 6/1994 |
| JP | 07-095013 | 4/1995 |

OTHER PUBLICATIONS

Notice of First Office Action dated Jul. 27, 2007 in Chinese Application No. 2005100648477 and English Translation thereof.
Japanese Office Action dtd Oct. 23, 2007 for JP Patent Application No. 2004-113439.

* cited by examiner

Primary Examiner—James C. Kerveros
(74) Attorney, Agent, or Firm—Banner & Witcoff, Ltd

(57) ABSTRACT

A flip flop circuit includes a first latch circuit which latches an input data at a leading edge of a clock signal, a second latch circuit which latches the input data at a trailing edge of the clock signal, and a selector which, during a period from the leading edge to the trailing edge of the clock signal, selects an output data from the first latch circuit, and during a period of the trailing edge to a next leading edge of the clock signal, selects an output data from the second latch circuit, in which one of the first latch circuit and the second latch circuit functions as a master latch circuit for receiving a scan data during a scan mode, and the other of the first latch circuit and the second latch circuit functions as a slave latch circuit for latching data outputted from the master latch circuit.

8 Claims, 8 Drawing Sheets

FLIP FLOP CIRCUIT AND APPARATUS USING A FLIP FLOP CIRCUIT

CROSS-REFERENCE TO RELATED APPLICATIONS

This application is based upon and claims the benefit of priority from prior Japanese Patent Application No. 2004-113439, filed Apr. 7, 2004, the entire contents of which are incorporated herein by reference.

BACKGROUND OF THE INVENTION

1. Field of the Invention

The present invention relates to a flip flop circuit and an apparatus using a flip flop circuit, and more particularly, to a double data rate (DDR) type flip flop circuit having a scan function and an apparatus using a DDR type flip flop circuit having a scan function.

2. Description of the Related Art

In recent years, in an LSI, there has been a demand for low power consumption and high speed operation. If a frequency of a clock signal is increased, power consumption of a circuit increases concurrently. Therefore, it is necessary to provide a flip flop capable of input and output data at a rate which is faster than the frequency of the clock signal.

As such a flip flop, there is known a DDR type flip flop for latching and outputting data at a speed which is two times as fast as the frequency of the clock signal. As the DDR type flip flop, there is known a circuit which includes two latch circuits and one selector (for example, refer to U.S. Pat. No. 6,525,565).

However, the flip flop of the U.S. Pat. No. 6,525,565 fails to comprise a scan function for inputting and outputting scan data used for testing. In general, in an LSI, it is necessary to use a flip flop with a scan function in order to achieve an operating test of an internal circuit. Therefore, it is necessary to achieve such a DDR type flip flop with a scan function. However, if a scan circuit for executing a scan function is added to the DDR type flip flop without changing a configuration, the number of elements required for the configuration of the DDR type flip flop is significantly increased.

BRIEF SUMMARY OF THE INVENTION

According to an aspect of the present invention, there is provided a flip flop circuit comprising:

a first latch circuit which latches an input data at a leading edge of a clock signal;

a second latch circuit which latches the input data at a trailing edge of the clock signal; and a selector which, during a period from the leading edge to the trailing edge of the clock signal, selects an output data from the first latch circuit, and during a period of the trailing edge to a next leading edge of the clock signal, selects an output data from the second latch circuit; in which one of the first latch circuit and the second latch circuit functions as a master latch circuit for receiving a scan data during a scan mode, and the other of the first latch circuit and the second latch circuit functions as a slave latch circuit for latching data outputted from the master latch circuit.

According to another aspect of the present invention, there is provided an apparatus comprising:

a data input terminal;
a data output terminal;
a clock input terminal;
a scan data input terminal;

a first latch circuit which latches an input data inputted to the data input terminal at a leading edge of a clock signal inputted to the clock input terminal;

a second latch circuit which latches the input data at a trailing edge of the clock signal;

a selector which, during a period from the leading edge to the trailing edge of the clock signal, selects an output data from the first latch circuit to output a selected output data to the data output terminal, and, during a period of the trailing edge to a next leading edge of the clock signal, selects an output data from the second latch circuit to output a selected output data to the data output terminal; and a scan data output terminal which outputs an output data from the second latch circuit;

a circuit which outputs the input data inputted to the data input terminal to the first latch circuit during a normal mode and outputs a scan data inputted to the scan data output terminal to the first latch circuit during a scan mode; and a circuit which outputs the input data inputted to the data input terminal to the second latch circuit during the normal mode and outputs the output data from the first latch circuit to the second latch circuit during the scan mode.

According to a further of the present invention, there is provided an apparatus comprising:

a data input terminal;
a data output terminal;
a clock input terminal;
a scan data input terminal;
a scan data output terminal;

a first latch circuit which latches an input data inputted to the data input terminal at a leading edge of a clock signal inputted to the clock input terminal;

a second latch circuit which, during a normal mode, latches the input data at a trailing edge of the clock signal, and, during a scan mode, latches a scan data inputted to the scan data input terminal in synchronism with a first scan clock signal inputted during the scan mode;

a selector which, during a period from the leading edge to the trailing edge of the clock signal, selects an output data from the first latch circuit to output a selected output data to the data output terminal, and, during a period of the trailing edge to a next leading edge of the clock signal, selects an output data from the second latch circuit to output a selected output data to the data output terminal; and a third latch circuit which, during the scan mode, latches the output data from the second latch circuit in synchronism with a second scan clock signal to output the latched output data to the scan data output terminal.

DETAILED DESCRIPTION OF THE INVENTION

Hereinafter, embodiments of the present invention will be described with reference to the accompanying drawings.

First Embodiment

Figure 1:
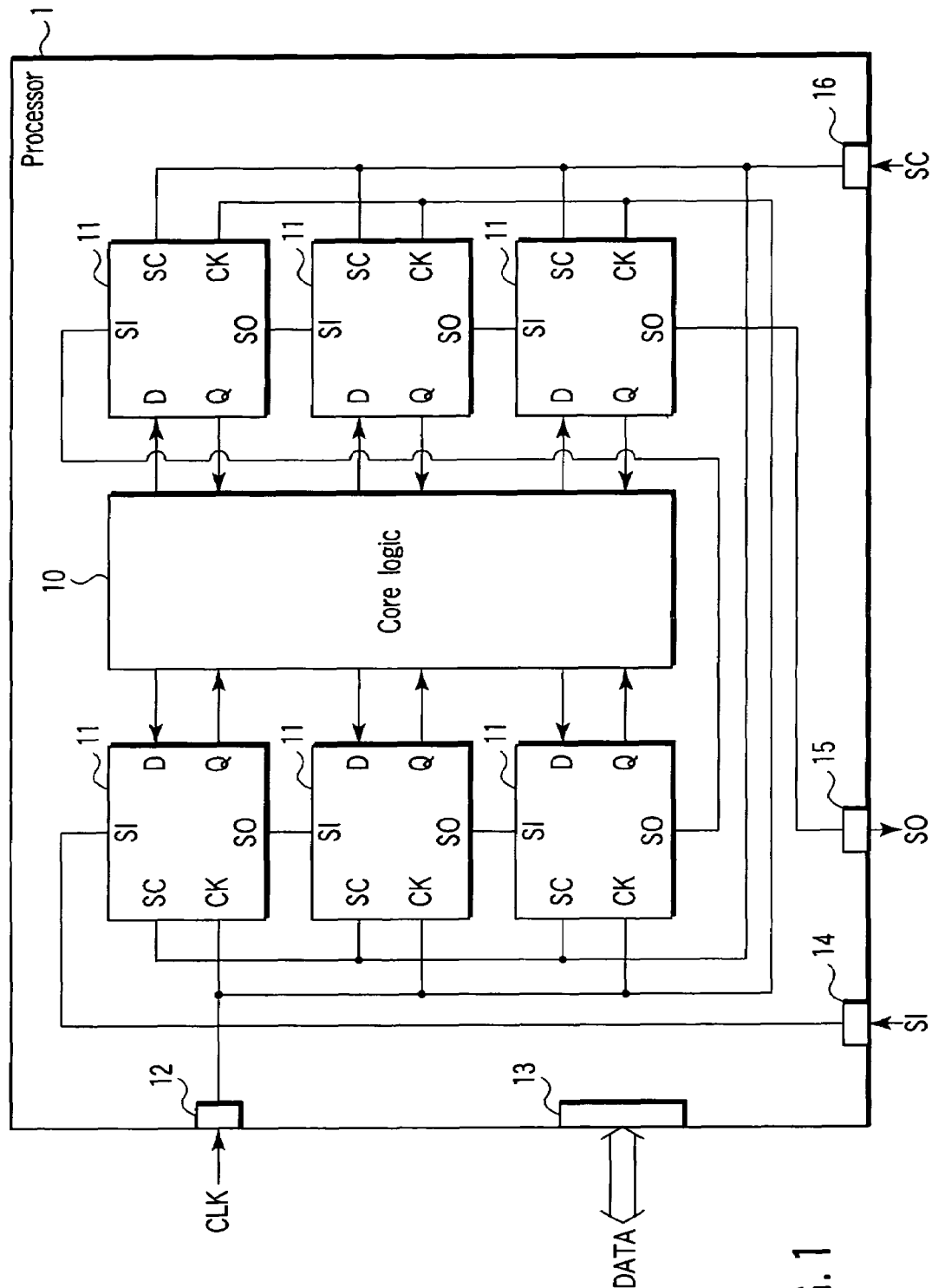
FIG. 1 is a block diagram of a semiconductor integrated circuit having incorporated therein a flip flop according to a first embodiment of the present invention.

In FIG. 1, a processor 1 is schematically depicted as an example of a semiconductor integrated circuit (LSI) having incorporated therein a flip flop according to a first embodiment of the present invention. The processor 1 includes a core logic 10 which is an internal circuit that operates at a rate of two times the frequency of a clock signal CLK inputted to a clock signal input terminal (CK). The core logic 10 comprises a plurality of logic circuits. Further, the processor 1 further includes a plurality of flip flops which carry out input/output of data between the flip flops and the core logic 10.

Each of the flip flops 11 is a DDR (Double Data Rate) type flip flop with a scan function, and comprises a data input terminal D, a data output terminal Q, a clock signal input terminal CK, a scan data input terminal SI, and a scan data output terminal SO, and a scan mode signal input terminal SC.

The processor 1 comprises a clock input pin 12 for inputting clock signal CLK from external, a plurality of data pins 13 for inputting/outputting data DATA of a width of a plurality of bits between the data pins and external, a scan data input pin 14 for inputting scan data in series from external, a scan data output pin 15 for outputting in series the scan data to external, and a scan mode signal input pin 16 for inputting the scan mode signal input terminal SC from external.

The data input terminal D and a data output terminal Q of each of the flip flops 11 are connected to the core logic 10. In the mean time, there exist flip flops whose data input terminals D are connected to the data pins 13 and the data output terminals Q are connected to the core logic 10, though not shown. Further more, in actual, there exist flip flops whose data input terminals D are connected to the core logic 10 and the data output terminals Q are connected to the data pins 13, though not shown.

Moreover, the clock signal input terminal CK of each of the flip flops 11 is connected to the clock input pin 12, and the scan mode signal input terminal SC is connected to the scan mode signal input pin 16. Further, the plurality of flip flops 11 are connected in a cascade scheme in which the scan data output terminal SO of a preceding stage flip flop is inputted to the scan data input terminal SI of the succeeding stage flip flop. The scan data input terminal SI of a first stage flip flop is connected to the scan data input pin 14. The scan data output terminal SO of a last stage flip flop is connected to the scan data output pin 15.

Each of the flip flops 11 is set to a normal mode or a scan mode by a scan mode signal SC inputted to the scan mode signal input terminal SC.

In a normal mode, each of the flip flops 11 makes a flip flop operation at a rate which is two times as fast as a frequency of the clock signal CLK inputted to the clock signal input terminal CK. That is, during the normal mode, each of the flip flops 11 latches the input data inputted to the data input terminal D at a leading edge (for example, rising edge) of the clock signal CLK and outputs the latched data to the data output terminal Q, and also latches the input data inputted to the data input terminal D at a trailing edge (for example, falling edge) of the clock signal CLK and outputs the latched data to the data output terminal Q. In this way, during the normal mode, each of the flip flops 11 functions as a DDR (Double Data Rate) type flip flop, and operates at a rate of two times as fast as a frequency of the clock signal CLK.

On the other hand, during the scan mode, each of the flip flops 11 latches the scan data inputted to the scan data input terminal SI at the leading edge of the clock signal CLK, and outputs the latched data from the scan data output terminal SO. Thus, during the scan mode, the flip flops 11 of the cascade connection scheme functions as a shift register.

Now, a description will be given with respect to a test operation for testing an operation of the core logic 10. Each of the flip flops 11 is set to the scan mode by the scan mode signal SC inputted to the scan mode signal input terminal SC. Next, a plurality of bit data of one test data pattern are serially inputted as the scan data from the scan data input pin 14. In this manner, a plurality of bit data of a test data pattern are set to a plurality of flip flops 11, respectively. Then, each of the flip flops 11 is operated in the normal mode. As a consequence, the above-described one test pattern set to the plurality of flip flops 11 is inputted to the core logic 10. Then, a plurality of bit data on one output data pattern from the core logic 10 which corresponds to this test data pattern are set to the plurality of flip flops 11, respectively. Thereafter, each of the flip flops 11 is set to the scan mode by the scan mode signal SC inputted to the scan mode signal input terminal SC. Thus, a plurality of bit data of one output data pattern are serially outputted from the scan data output pin 15.

Now, with reference to FIG. 2, a configuration of the flip flop 11 in the processor shown in FIG. 1 will be described hereinbelow.

Each of the flip flops 11 comprises a first latch circuit 21, a second latch circuit 22, an output selector 23, a first input selector 24, and a second input selector 25.

The first latch circuit 21 latches binary data "1" or "0" from the first input selector 24 at the leading edge of the clock signal CLK inputted to the clock signal input terminal CK, and holds the latched data until the falling edge of the clock signal CLK.

Node A is an output node of the first latch circuit 21. In the following description, it is assumed that the leading edge of the clock signal CLK is a rising edge, and the trailing edge is a falling edge of the clock signal CLK.

The first latch circuit 21 comprises a clocked inverter 111, an inverter 112, and a clocked inverter 113. The inverter 112 and the clocked inverter 113 constitutes a bistable circuit. The clocked inverter 111 is a CMOS clocked inverter which operates as an inverter during an "L" level period of the clock signal CLK inputted to the clock signal input terminal CK (FIG. 1). The clocked inverter 111 outputs an inverted logic level data of an output binary data "1" or "0" from the first input selector 24 during the "L" level period of the clock signal CLK. On the other hand, the output of the clocked inverter 111 becomes a high impedance output during an "H" level period of the clock signal CLK. The clocked inverter 113 is a CMOS clocked inverter which operates as an inverter during the "H" level period of the clock signal CLK inputted to the clock signal input terminal CK (FIG. 1). The clocked inverter 113 outputs an inverted logic level data of an output data from the inverter 112, during the "H" level period of the clock signal CLK. On the other hand, the output of the clocked inverter 113 becomes a high impedance output during the "L" level period of the clock signal CLK.

During the "L" level period of the clock signal CLK, the inverted logic level data of output binary data "1" or "0" from the first input selector 24 is presented on the node A. The data on the node A is latched by the bistable circuit formed of the inverter 112 and the clocked inverter 113 at the rising edge from the "L" level to the "H" level of the clock signal CLK. The latched data is held during the "H" level period of the clock signal CLK.

The second latch circuit 22 latches a binary data "1" or "0" from the second input selector 25 at a rising edge of the clock signal CLK inputted to the clock signal input terminal CK, and holds the latched data until the next rising edge of the clock signal CLK. Node B is an output node of the second latch circuit 22.

The second latch circuit 22 comprises a clocked inverter 114, an inverter 115, and a clocked inverter 116. The inverter 115 and the clocked inverter 116 constitutes a bistable circuit. The clocked inverter 114 is a CMOS clocked inverter which operates as an inverter during an "H" level period of the clock signal CLK inputted to the clock signal input terminal CK (FIG. 1). The clocked inverter 114 outputs an inverted logic level data of an output binary data "1" or "0" from the second input selector 25 during the "H" level period of the clock signal CLK. On the other hand, the output of the clocked inverter 114 becomes a high impedance output during an "L" level period of the clock signal CLK. The clocked inverter 116 is a CMOS clocked inverter which operates as an inverter during the "L" level period of the clock signal CLK inputted to the clock signal input terminal CK. The clocked inverter 116 outputs an inverted logic level data of an output data from the inverter 115, during the "L" level period of the clock signal CLK. On the other hand, the output of the clocked inverter 116 becomes a high impedance output during an "H" level period of the clock signal CLK.

During the "H" level period of the clock signal CLK, the inverted logic level data of output binary data "1" or "0" from the second input selector 25 is presented on the node B. The data on the node B is latched by the bistable circuit formed of the inverter 115 and the clocked inverter 116 at the falling edge from the "H" level to the "L" level of the clock signal CLK. The latched data is held during the "L" level period of the clock signal CLK.

The output selector 23 selects one of the first latch circuit 21 and the second latch circuit 22 in accordance with a logic level of the clock signal CLK inputted to the clock signal input terminal CK, and outputs an output data from the selected latch circuit to a data output terminal Q. Specifically, the output selector 23 selects the first latch circuit 21 during the "H" level period of the clock signal CLK inputted to the clock signal input terminal CK, and outputs the output data from the first latch circuit 21 to the data output terminal Q. On the other hand, the output selector 23 selects the second latch circuit 22 during the "L" level period of the clock signal CLK inputted to the clock signal input terminal CK, and outputs the output data from the second latch circuit 22 to the data output terminal Q. The selector 23 is made of two clocked inverters, i.e., a clocked inverter 117 and a clocked inverter 118. The clocked inverter 117 outputs an inverted logic level data of the data on the node A during the "H" level period of the clock signal CLK. The clocked inverter 118 outputs an inverted logic level data of the data on the node B during the "L" level period of the clock signal CLK.

The first input selector 24 selects one of the data input terminal D and the scan data input terminal SI in accordance with a logic level of an scan mode signal SC inputted to the scan mode signal input terminal SC, and connects the selected terminal to the first latch circuit 21. Specifically, the first input selector 24 outputs an input data inputted from the data input terminal D to the first latch circuit 21 during a normal mode period (the scan mode signal SC being the "L" level). On the other hand, the first input selector 24 outputs a scan data inputted from the scan data input terminal SI to the first latch circuit 21 during a scan mode period (the scan mode signal SC being the "H" level).

The second input selector 25 selects one of an output terminal of the first latch circuit 21 and the data input terminal D in accordance with a logic level of the scan mode signal SC inputted to the scan mode signal input terminal SC, and connects the selected terminal to the second latch circuit 22. Specifically, the second input selector 25 outputs the input data inputted from the data input terminal D to the second latch circuit 22 during the normal mode period (the scan mode signal SC being the "L" level). On the other hand, the second input selector 25 outputs an output signal of the first latch circuit 21 to the second latch circuit 22 during the scan mode period (the scan mode signal SC being the "H" level).

As described above, during the scan mode, the output data from the first latch circuit 21 is fed back to the second latch circuit 22. In this manner, during the scan mode, the first latch circuit 21 functions as a master latch circuit used for scanning, and the second latch circuit 22 functions as a slave latch circuit used for scanning. An output of the second latch circuit 22 is connected to the scan data output terminal SO. The node A may be connected to the second latch circuit 22 via the second input selector 25 in a form of a feedback loop, and the node B may be connected to the scan data output terminal SO.

On the other hand, during the normal mode, on the other hand, an input data inputted from a data input terminal D is inputted to both of the first latch circuit 21 and the second latch circuit 22. Thus, the first latch circuit 21 and the second latch circuit 22 function as master latches used for DDR, respectively.

Figure 2:
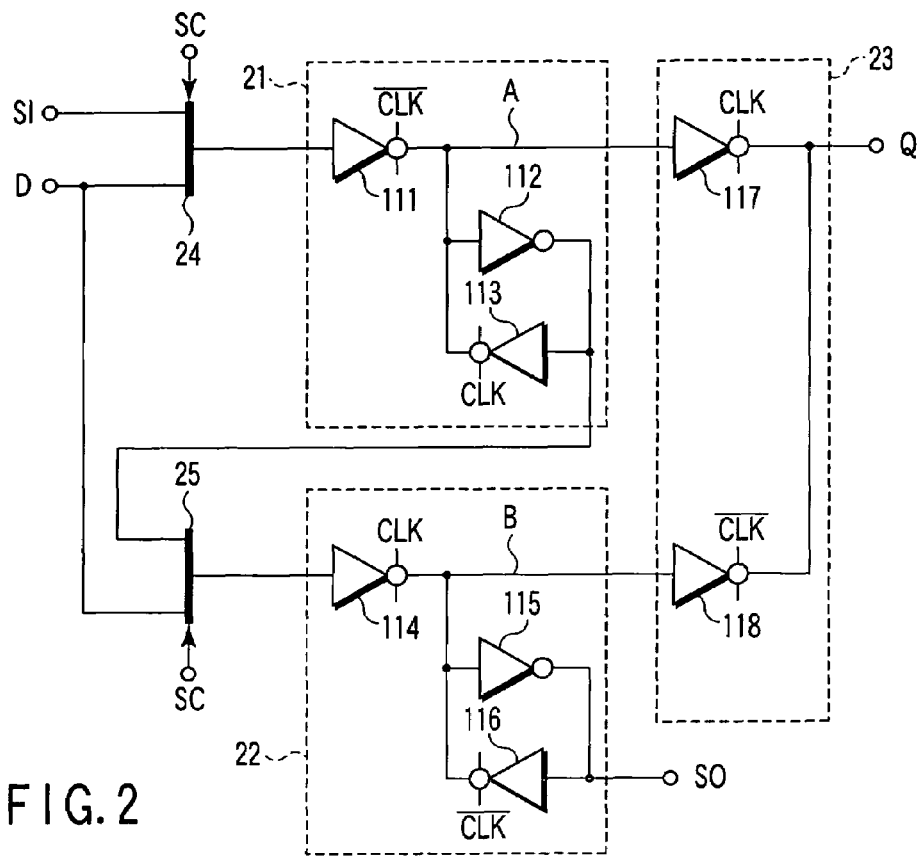
FIG. 2 is a block diagram of a flip flop in a processor shown in FIG. 1.
Figure 3:
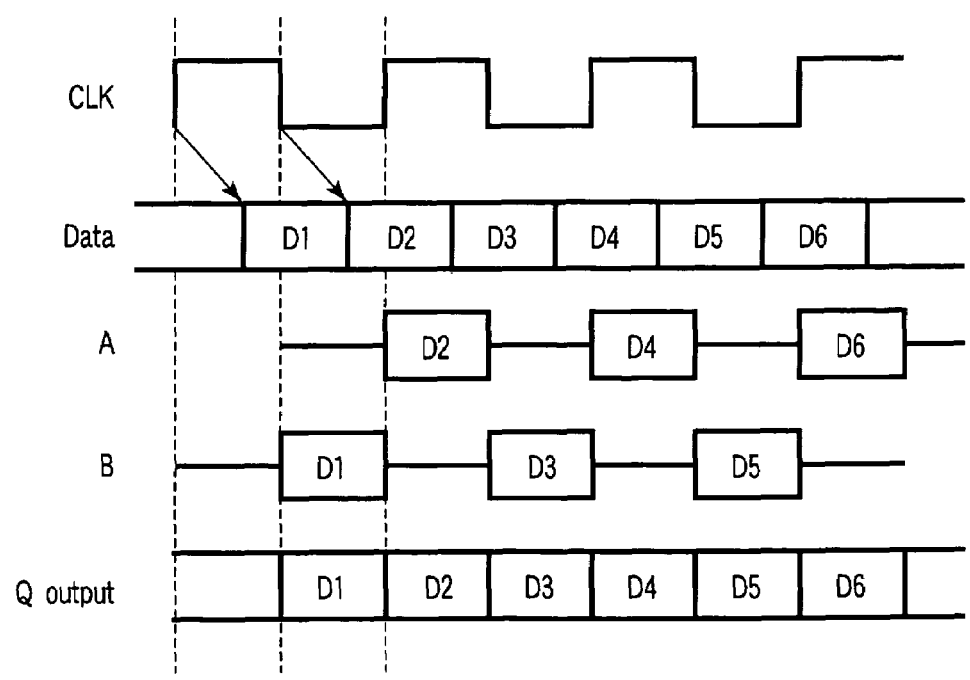
FIG. 3 is a timing chart of an operation during a normal mode of the flip flop shown in FIG. 1.

FIG. 3 is a timing chart schematically depicting an operation of the flip flop 11 shown in FIG. 2 in the normal mode. With reference to FIGS. 2 and 3, an operation in the normal mode of the flip flop 11 shown in FIG. 2 will be described below.

Input data bit D1, D2, D3, D4, . . . are sequentially inputted to the data input terminal D at a period which is ½ of that of the clock signal CLK. The input data D1, D2, D3, D4, . . . are alternately latched by the first latch circuit 21 and the second latch circuit 22. To be more specific, the input data D1 is latched by the second latch circuit 22 at a falling edge of the clock signal CLK, and outputted from the data output terminal Q as a Q output during a period from a falling edge of the clock signal CLK to the succeeding rising edge of the clock signal CLK. Next, the input data D2 is latched by the first latch circuit 21 at the rising edge of the clock signal CLK, and outputted from the data output terminal Q as the Q output during a period from the rising edge of the clock signal CLK to the succeeding falling edge of the clock signal CLK. In actual, the input data from the input terminal D is outputted to the node A as it is during the "L" level period of the clock signal CLK, and, on the other hand, the input data from the input terminal D is outputted to the node B as it is during the "H" level period of the clock signal CLK.

Figure 4:
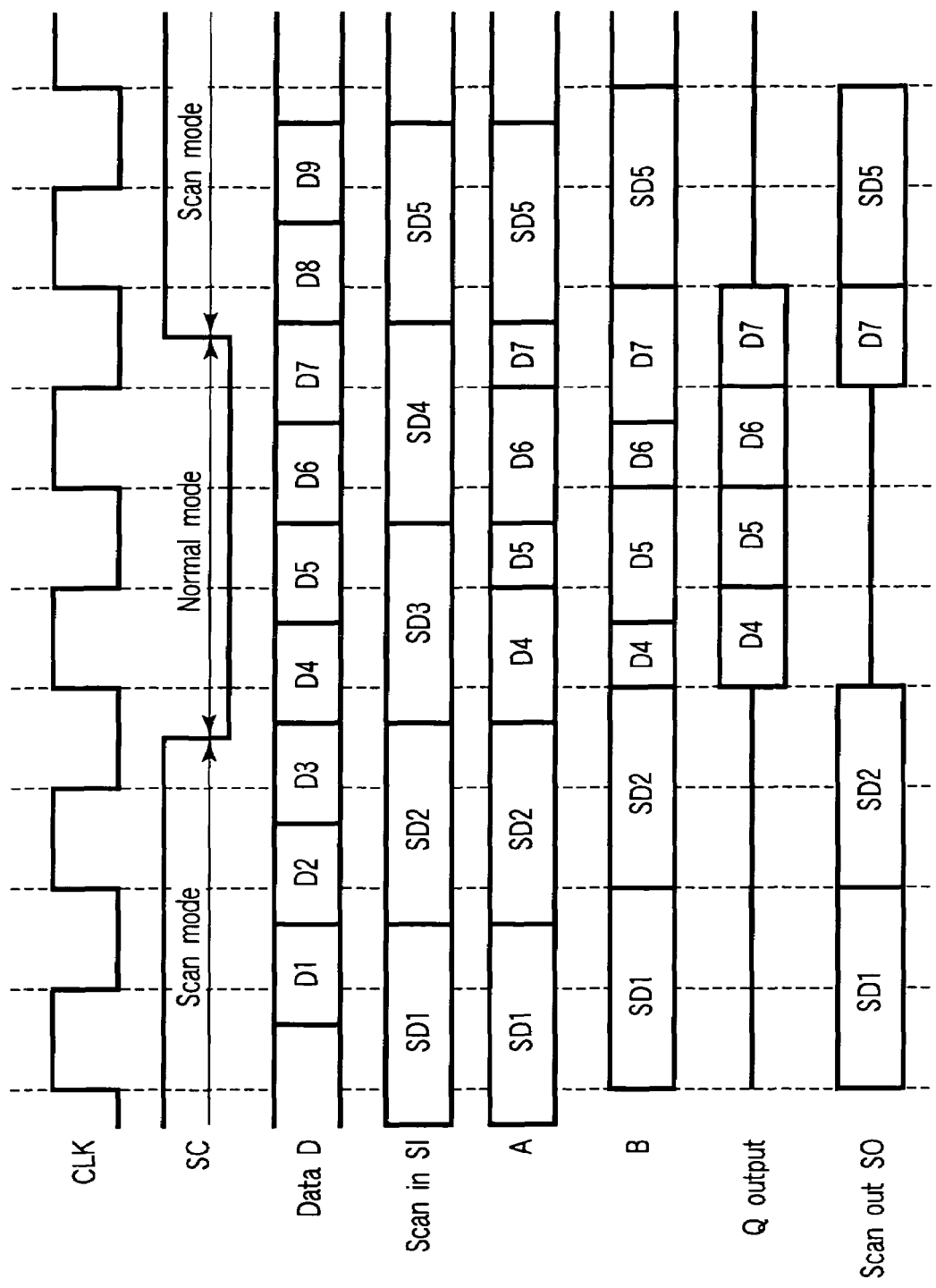
FIG. 4 is a timing chart showing operations during the normal mode and scan mode of the flip flop according to the first embodiment.

FIG. 4 is a specific timing chart of operations in the normal mode and scan mode of the flip flop 11 shown in FIG. 2. With reference to FIGS. 2 and 4, the operations in the normal mode and the scan mode of the flip flop 11 shown in FIG. 2 will be described below in detail. In each of the normal mode and the scan mode, scan data SD1, SD2, SD3, SD4, . . . and input data D1, D2, D3, D4 are sequentially inputted.

The scan data SD1, SD2, SD3, SD4, . . . are sequentially inputted to the scan data input terminal SI (FIG. 2) at a period which is equal to the period of the clock signal CLK. During the scan mode (the scan mode signal SC being the "H" level), scan data is latched by the first latch circuit 21 at a rising edge of the clock signal CLK. Data on the output node A forming a latch output node of the first latch circuit 21 (FIG. 2) is latched by the second latch circuit 22 (FIG. 2) at the falling edge of the clock signal CLK. Thus, the flip flop 11 functions as a master/slave type flip flop. That is, the first latch circuit 21 and the second latch circuit 22 function as a master latch circuit used for scanning and a slave latch circuit used for scanning, respectively. A scan circuit formed of the first latch circuit 21 and the second latch circuit 22 latches scan data at a rising edge of the clock signal CLK, and outputs the latched scan data to the scan data output terminal SO. The operation during the normal mode (the scan mode signal SC being the "L" level) is already described with reference to FIG. 3.

Figure 5:
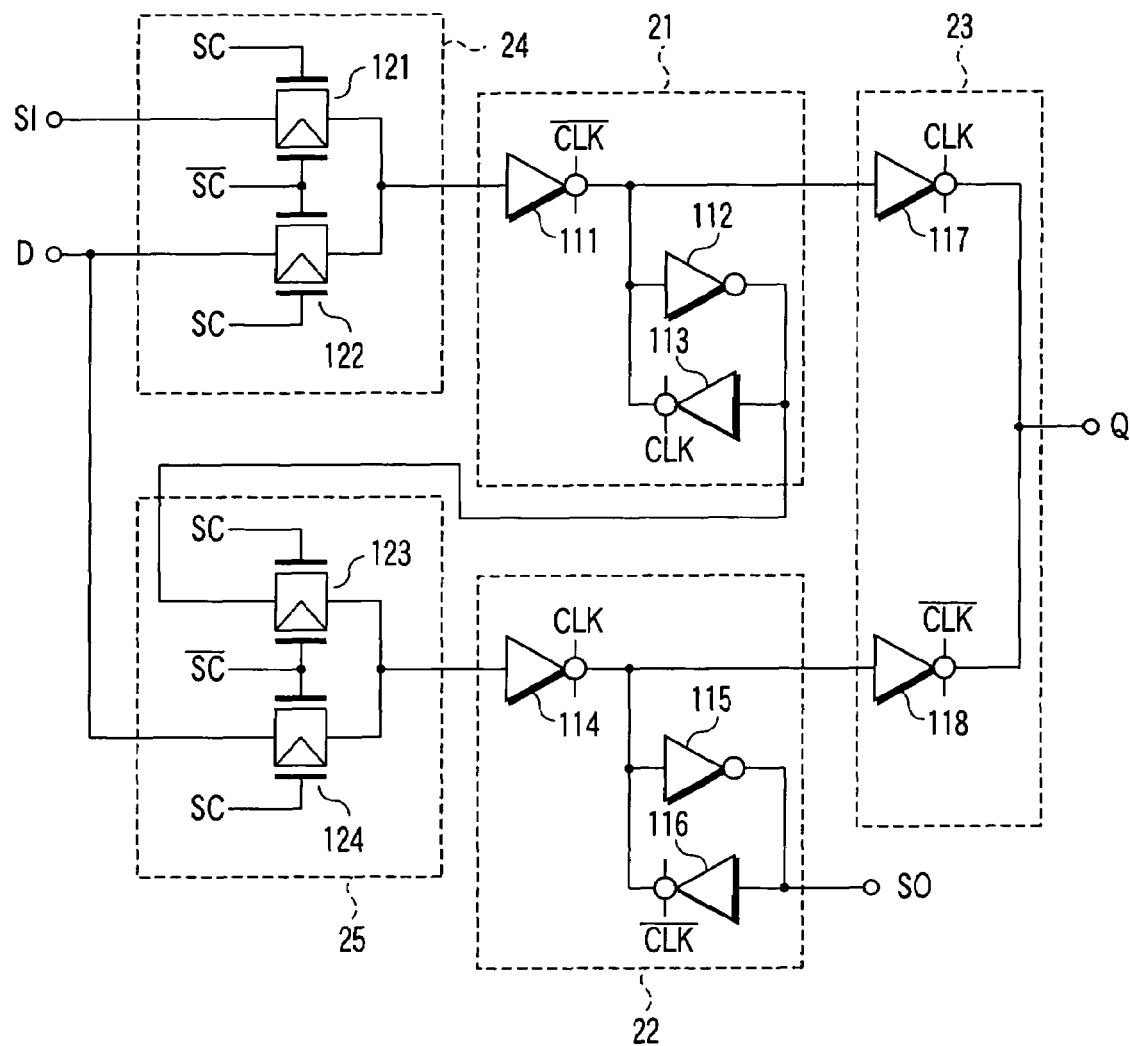
FIG. 5 is a diagram showing a first example of the specific circuit configuration of the flip flop according to the first embodiment.

FIG. 5 shows a circuit configuration of the flip flop 11 in the processor shown in FIG. 1 in more detail as compared with the circuit configuration shown in FIG. 2. Specifically, the circuit configuration of each of the first input selector 24 and the second input selector 25 is shown in more detail as compared with the circuit configuration shown in FIG. 2.

The first input selector 24 comprises two transfer gates, i.e., a transfer gate 121 and a transfer gate 122. The transfer gate 121 connects the scan data input terminal SI to the first latch circuit 21 in the scan mode. The transfer gate 121 comprises an N channel MOS transistor to whose gate a scan mode signal SC is inputted and a P channel MOS transistor to whose gate an inverted signal (a signal whose logic level is inverted) of the scan mode signal SC is inputted. The transfer gate 122 connects the data input terminal D to the first latch circuit 21 in the normal mode. The transfer gate 122 comprises a P channel MOS transistor to whose gate the scan mode signal SC is inputted and an N channel MOS transistor to whose gate the inverted signal of the scan mode signal SC is inputted.

The second input selector 25 comprises two transfer gates, i.e., a transfer gate 123 and a transfer gate 124. The transfer gate 123 outputs an output signal of the first latch circuit 21 to the second latch circuit 22 in the scan mode. The transfer gate 123 comprises an N channel MOS transistor to whose gate the scan mode signal SC is inputted and a P channel MOS transistor to whose gate the inverted signal of the scan mode signal SC is inputted. The transfer gate 124 connects the data input terminal D to the second latch circuit 22 in the normal mode. The transfer gate 124 comprises a P channel MOS transistor to whose gate the scan mode signal SC is inputted and an N channel MOS transistor to whose gate the inverted signal of the scan mode signal SC is inputted.

Figure 6:
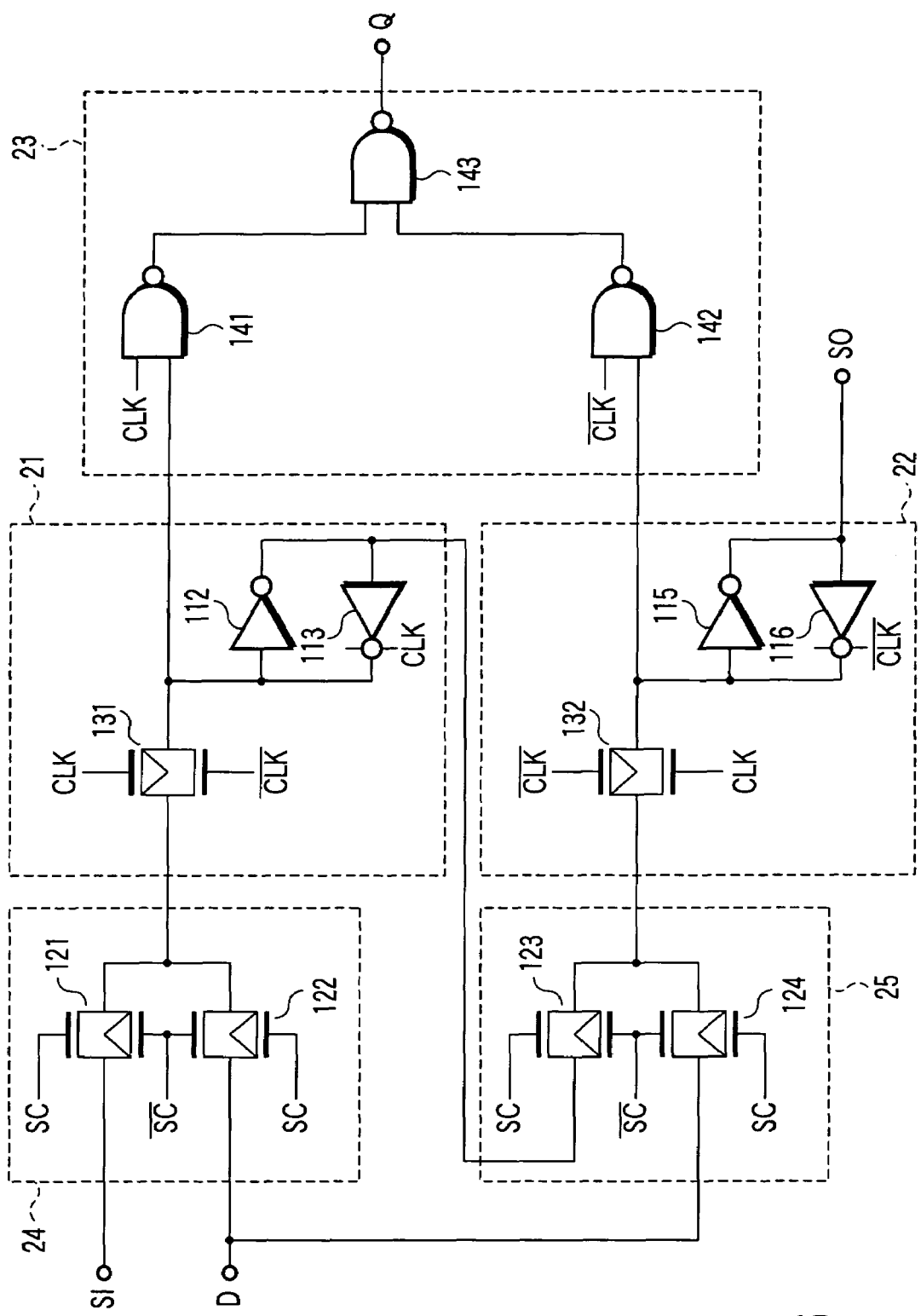
FIG. 6 is a diagram showing a second example of the specific circuit configuration of the flip flop according to the first embodiment.

FIG. 6 shows a modified example of the circuit configuration shown in FIG. 5.

In this modified example, an output selector 23 is realized by using three NAND gates 141 to 143. A high speed operation can be achieved as compare with a case of using clocked inverters. Also, in this modified example, a transfer gate 131 is used in place of the clocked inverter 111 in the first latch circuit 21 in FIG. 5, and a transfer gate 132 is used in place of the clocked inverter 114 in the first latch circuit 21 in FIG. 5. An output signal of the transfer gate 131 is inputted to one input terminal of the NAND gate 141, and the clock signal CLK is inputted to the other input terminal of the NAND gate 141. Similarly, an output signal of the transfer gate 132 is inputted to one input terminal of the NAND gate 142, and the inverted clock signal /CLK is inputted to the other input terminal of the NAND gate 142. Output signals of the NAND gates 141 and 142 are inputted to the NAND gate 143, and an output signal Q is outputted from the NAND gate 143.

As described above, in the first embodiment, two latch circuits 21 and 22 configuring a DDR flip flop are constructed so as to be compatible with a master latch used for scanning and a slave latch used for scanning, respectively, thus making it possible to achieve both of the scan operation and the DDR flip flop operation with a small number of elements.

Second Embodiment

Figure 7:
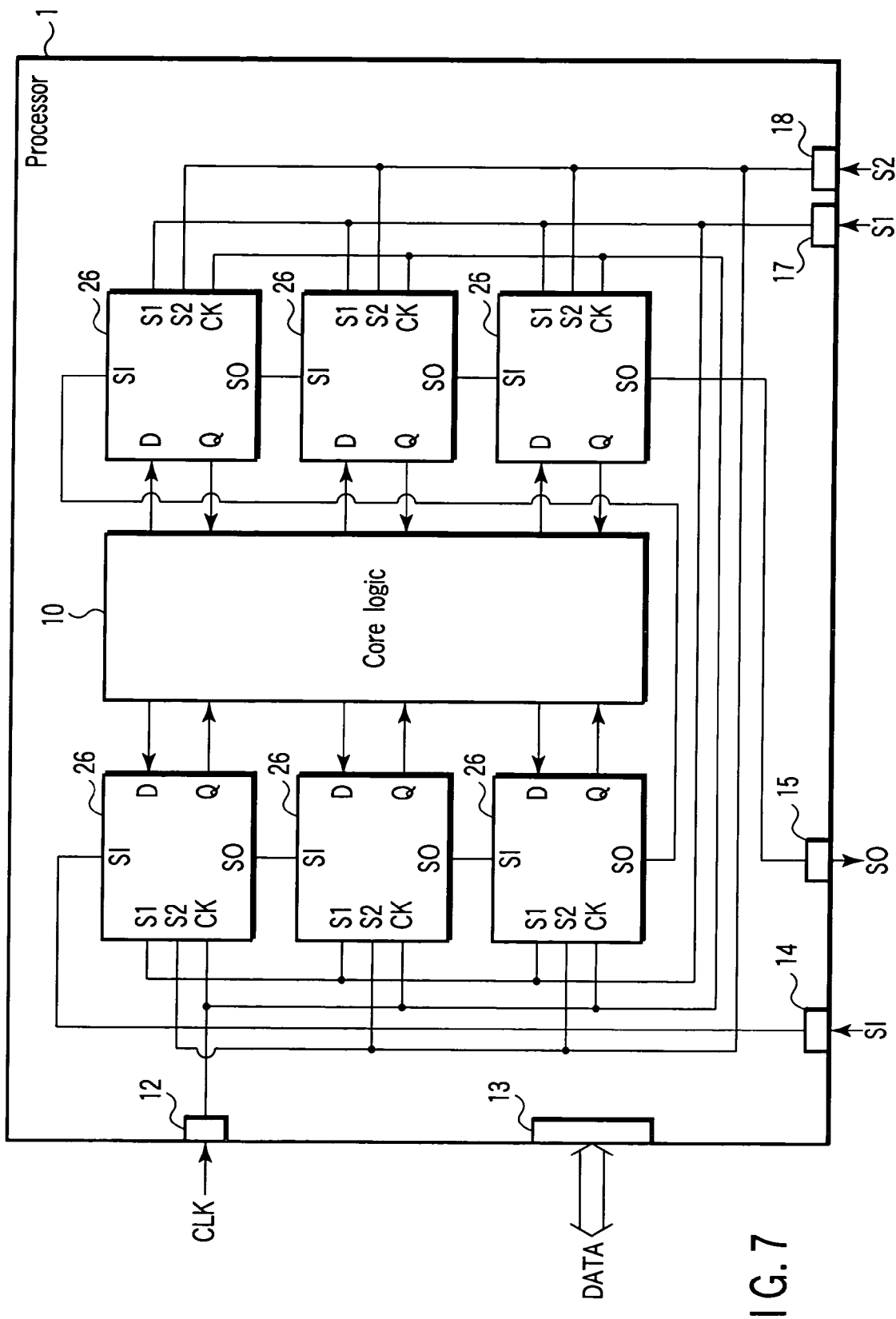
FIG. 7 is a block diagram depicting a configuration of a semiconductor integrated circuit having incorporated therein a flip flop according to a second embodiment of the present invention.

FIG. 7 schematically shows a processor as an example of a semiconductor integrated circuit (LSI) having incorporated therein a flip flop according to a second embodiment of the present invention. Same elements in the first embodiment are designated by same reference numerals. In the processor 1, first and second scan clock signal input pins 17 and 18 for externally inputting first and second scan clock signals S1 and S2 are provided instead of a scan mode signal input pin 16 shown in FIG. 1. First and second scan clock signals S1 and S2 are provided as signals used instead of the scan mode signal SC, and these signals compatibly function as the clock signal CLK in the scan mode. That is, the scan clock signal S1 is used as a clock for controlling an operation of the master latch circuit used for scanning, and the scan clock signal S2 is used as a clock for controlling an operation of the slave latch circuit used for scanning. By externally inputting these scan clock signals S1 and S2, a sufficient hold time can be established in the scan mode.

Further, the processor 1 includes a plurality of flip flops 26 which carry out input/output of data between the flip flops and the core logic 10.

Each of the flip flops 26 is a DDR (Double Data Rate) type flip flop with a scan function, and comprises a data input terminal D, a data output terminal Q, a clock signal input terminal CK, a scan data input terminal SI, and a scan data output terminal SO, a first scan clock signal input terminal S1, and a second scan clock signal input terminal S2.

The clock signal input terminal CK of each of the flip flops 26 is connected to the clock input pin 12, the first scan clock signal input terminal S1 is connected to the first scan clock signal input pin 17, and the second scan clock signal input terminal S2 is connected to the second scan clock signal input pin 18. Further, the plurality of flip flops 26 are connected in a cascade scheme in which the scan data output terminal SO of a preceding stage flip flop is inputted to the scan data input terminal SI of the succeeding stage flip flop. For example, it is possible that an inverted signal of the first scan clock signal S1 is generated in the flip flop 26, and the inverted signal is used as the second scan clock signal S2.

Each of the flip flops 26 is set to the normal mode when the first scan clock signal S1 and the second scan clock signal S2 are fixed to the "L" level, and to the scan mode the first scan clock signal S1 and the second scan clock signal S2 are inputted. In the scan mode, each of the flip flops 26 carries out a scan operation in synchronism with the first scan clock signal S1 and the second scan clock signal S2. In the scan mode, the supply of clock signal CLK is stopped.

In the above description, it is assumed that the leading edge of the clock signal CLK is a rising edge, and the trailing edge is a falling edge. However, to the contrary, it is possible that the leading edge of the clock signal CLK is a falling edge, and the trailing edge of the clock signal CLK is a rising edge. In the case, the "L" level should be read the "H" level, and the "H" level should be read the "L" level, respectively.

Now, with reference to FIG. 8 a configuration of the flip flop 26 in the processor shown in FIG. 7 will be described hereinbelow.

Each of the flip flops 26 comprises a first latch circuit 31, a second latch circuit 32, an output selector 33, and a third latch circuit 34.

The first latch circuit 31 latches a binary data "1" or "0" inputted via the data input terminal D at the rising edge of the clock signal CLK inputted to the clock signal input terminal CK (FIG. 7), and holds the latched data until the falling edge of the clock signal CLK. Node A forms an output node of the first latch circuit 31. In the following description, it is assumed that the leading edge of the clock signal CLK is a rising edge, and the trailing edge of the clock signal CLK is a falling edge.

The first latch circuit 31 comprises a clocked inverter 211, an inverter 212, and a clocked inverter 213. The inverter 212 and the clocked inverter 213 constitutes a bistable circuit. The clocked inverter 211 is a CMOS clocked inverter which operates as an inverter during an "L" level period of the clock signal CLK inputted to the clock signal input terminal CK. The clocked inverter 211 outputs an inverted logic level data of an output binary data "1" or "0" inputted via the data terminal D during the "L" level period of the clock signal CLK. On the other hand, the output of the clocked inverter 211 becomes a high impedance output during an "H" level period of the clock signal CLK. The clocked inverter 213 is a CMOS clocked inverter which operates as an inverter during the "H" level period of the clock signal CLK inputted to the clock signal input terminal CK. The clocked inverter 213 outputs an inverted logic level data of an output data from the inverter 212 during the "H" level period of the clock signal CLK. On the other hand, the output of the clocked inverter 213 becomes a high impedance output during an "L" level period of the clock signal CLK.

During the "L" level period of the clock signal CLK, an inverted logic level data of a binary data "1" or "0" inputted via the data input terminal D is presented on the node A. The data on the node A is latched by the bistable circuit formed of the inverter 212 and the clocked inverter 213 at the rising edge from the "L" level to the "H" level of the clock signal CLK. The latched data is held during the "H" level period of the clock signal CLK.

The second latch circuit 32 latches during the normal mode the binary data "1" or "0" inputted via the data input terminal D at a falling edge of the clock signal CLK inputted to the clock signal input terminal CK, and holds the latched data until the next rising edge of the clock signal CLK. Node B is an output node of the second latch circuit 32. On the other hand, during the scan mode, the second latch circuit 32 latches a binary data (scan data) "1" or "0" inputted via the scan data input terminal SI at a falling edge of the first scan clock signal S1 inputted to the first scan clock signal input terminal S1, and holds the latched data until the next rising edge of the scan clock signal S1.

The second latch circuit 32 comprises a clocked inverter 214, an inverter 215, a clocked inverter 216, transfer gate 217, and a clocked inverter 218.

The clocked inverter 214 is a CMOS clocked inverter which operates as an inverter during the "H" level period of the clock signal CLK. The clocked inverter 214 outputs an inverted logic level data of the binary data "1" or "0" inputted via the data input terminal D during the "H" level period of the clock signal CLK. On the other hand, the output of the clocked inverter 214 becomes a high impedance output during an "L" level period of the clock signal CLK. The clocked inverter 216 is a CMOS clocked inverter which operates as an inverter during an "L" level period of the first scan clock signal S1. The clocked inverter 216 outputs an inverted logic level data of an output data from the inverter 215 during the "L" level period of the first scan clock signal S1. On the other hand, the output of the clocked inverter 216 becomes a high impedance output during an "H" level period of the scan clock signal S1. The transfer gate 217 comprises a P channel MOS transistor to whose gate the clock signal CLK is inputted and an N channel MOS transistor to whose gate an inverted signal of the clock signal CLK is inputted. The transfer gate 217 is turned on during the "L" level period of the clock signal CLK, and turned off during the "H" level period of the clock signal CLK. The clocked inverter 218 is a CMOS clocked inverter which operates as an inverter during the "H" level period of the first scan clock signal S1. The clocked inverter 218 outputs an inverted logic level data of the binary data "1" or "0" inputted via the scan data input terminal S1 during the "H" level period of the first scan clock signal S1. On the other hand, the output of the clocked inverter 218 becomes a high impedance output during the "L" level period of the first scan clock signal S1.

In the normal mode, the first scan clock signal S1 is fixed to the "L" level. Thus, the clocked inverter 214, the inverter 215, the clocked inverter 216, and the transfer gate 217 function as a latch circuit for the normal mode. That is, during the normal mode, the inverted logic level data of an output binary data "1" or "0" inputted via data input terminal D is presented on the node B. The data on the node B is latched by the bistable circuit formed of the inverter 215, the clocked inverter 216 and the transfer gate 217 at the falling edge from the "H" level to the "L" level of the clock signal CLK. The latched data is held during the "L" level period of the clock signal CLK.

In the scan mode, the first scan clock signal S1 and the second scan clock signal S2 are inputted in place of the clock signal CLK. Thus, the clocked inverter 218, the inverter 215, the clocked inverter 216, and the transfer gate 217 function as a master latch circuit for scanning. That is, during the scan mode, the inverted logic level data of a scan data inputted via the scan data input terminal SI is presented on the output node of the clocked inverter 218 during the "H" level period of the scan clock signal S1. The data on the output node of the clocked inverter 218 is latched by the bistable circuit formed of the inverter 215, the clocked inverter 216 and the transfer gate 217 at the falling edge from the "H" level to the "L" level of the scan clock signal S1. The latched data is held during the "L" level period of the scan clock signal S1. Data on the output node of the clocked inverter 218 is the same as that on the node B.

The output selector 33 selects one of the first latch circuit 31 and the second latch circuit 32 in accordance with a logic level of the clock signal CLK inputted to the clock signal input terminal CK, and outputs an output data from the selected latch circuit to the data output terminal Q. Specifically, the output selector 33 selects the first latch circuit 31 during the "H" level period of the clock signal CLK inputted to the clock signal input terminal CK, and outputs the output data from the first latch circuit 31 to the data output terminal Q. On the other hand, the output selector 33 selects the second latch circuit 32 during the "L" level period of the clock signal CLK inputted to the clock signal input terminal CK, and outputs the output data from the second latch circuit 32 to the data output terminal Q. The output selector 33 is formed of two clocked inverters, i.e., a clocked inverter 219 and a clocked inverter 220. The clocked inverter 219 outputs an inverted logic level data of the data on the node A during the "H" level period of the clock signal CLK. The clocked inverter 220 outputs an inverted logic level data of the data on the node B during the "L" level period of the clock signal CLK.

The third latch circuit 34 is a slave latch circuit for scanning, and comprises a clocked inverter 221, an inverter 222, and a clocked inverter 223. The inverter 222 and the clocked inverter 223 constitutes a bistable circuit. The clocked inverter 211 is a CMOS clocked inverter which operates as an inverter during an "H" level period of the second scan clock signal S2 inputted during the scan mode. The clocked inverter 221 outputs an inverted logic level data of an output binary data "1" or "0" of the second latch circuit 32 during the "H" level period of the second scan clock signal S2. On the other hand, the output of the clocked inverter 221 becomes a high impedance output during the "L" level period of the second scan clock signal S2. The clocked inverter 223 is a CMOS clocked inverter which operates as an inverter during the "L" level period of the second scan clock signal S2. The clocked inverter 223 outputs an inverted logic level data of an output data from the inverter 222 during the "L" level period of the second scan clock signal S2. On the other hand, the output of the clocked inverter 223 becomes a high impedance output during the "H" level period of the second scan clock signal S2.

During the "H" level period of the second scan clock signal S2, an inverted logic level data of an output data of the second latch circuit 32 is presented on the scan data output terminal SO. An output data of the clocked inverter 221 is latched by a bistable circuit formed of the inverter 222 and the clocked inverter 223 at the falling edge from the "H" level to the "L" level of the second scan clock signal S2. The latched data is held during the "L" level period of the second scan clock signal S2.

Figure 8:
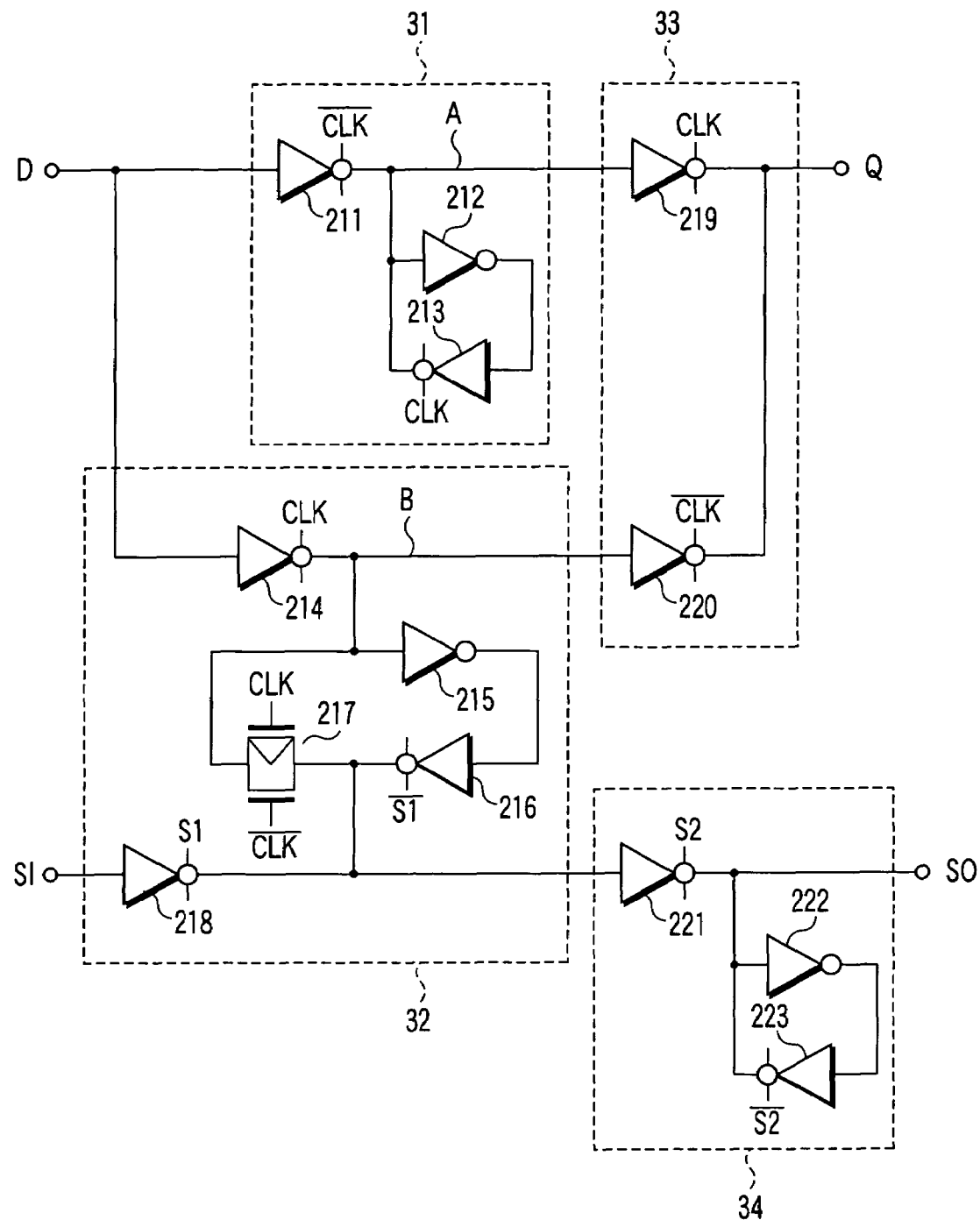
FIG. 8 is a diagram showing a configuration of a flip flop according to the second embodiment.
Figure 9:
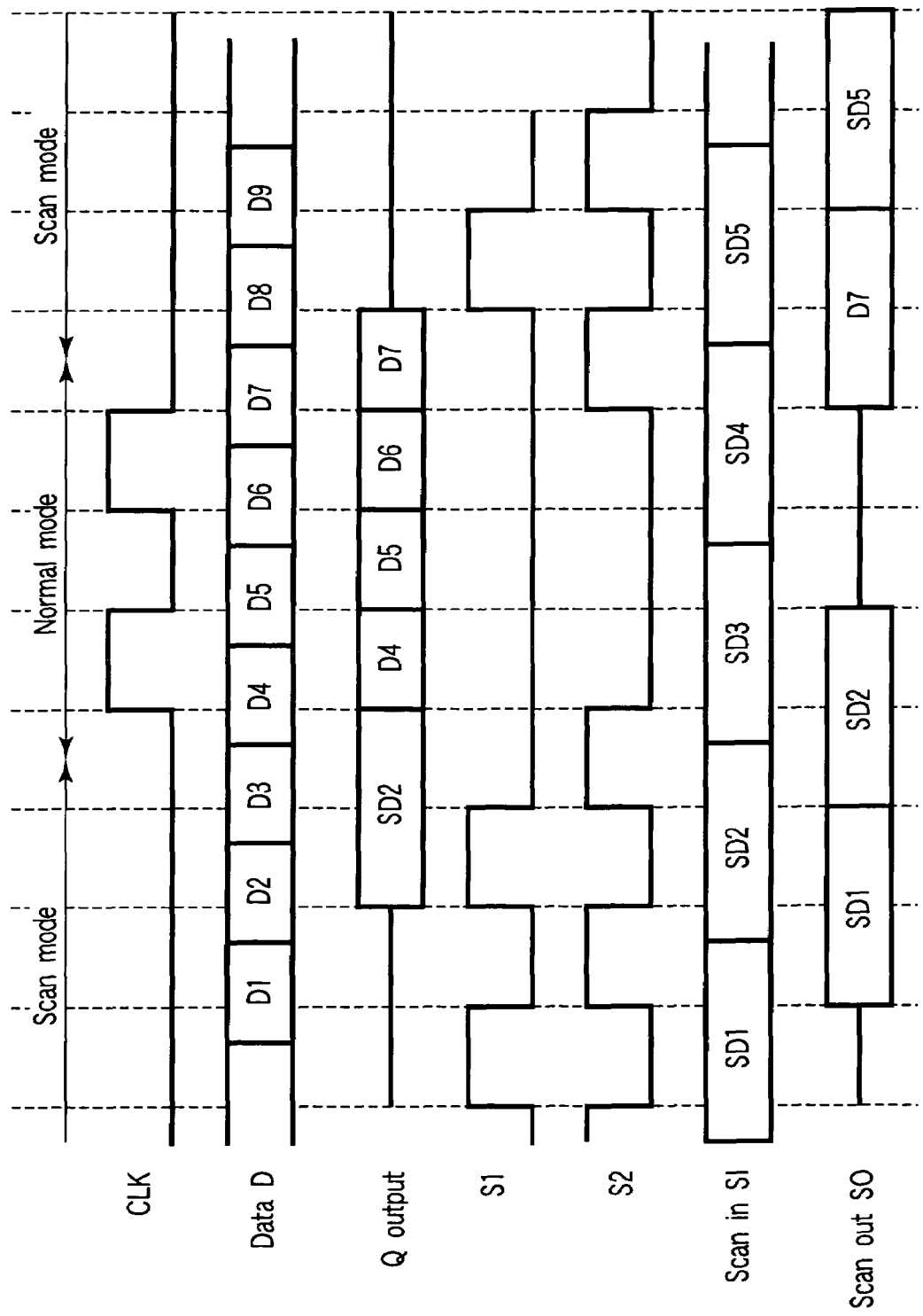
FIG. 9 is a timing chart showing operations during the normal mode and scan mode according to the second embodiment.

FIG. 9 is a specific timing chart of operations in a normal mode and a scan mode of a flip flop 26 shown in FIG. 8. With reference to FIGS. 8 and 9, a description will now be given with respect to operations in the normal mode and the scan mode of the flip flop 26 shown in FIG. 8. In both of the normal mode and the scan mode, scan data SD1, SD2, SD3, SD4, . . . and input data D1, D2, D3, D4 are sequentially inputted.

During the scan mode, first and second scan clock signals S1 and S2 are inputted, and the clock signal CLK is locked to the "L" level. In FIG. 9, the first scan clock signal S1 and the second scan clock signal S2 are complementary to each other. However, to ensure the data hold time, the first scan clock signal S1 may be made to rise after the second scan clock signal S2 falls. The scan data SD1, SD2, SD3, SD4, . . . are sequentially inputted to the scan data input terminal SI. The scan data SD1 is latched by the second latch circuit 32 at the falling edge of the scan clock signal S1. The scan data SD1 latched by the second latch circuit 32 is outputted to the scan data output terminal SO via the clocked inverter 221 of the third latch circuit 34 during the "H" level period of the scan clock signal S2. Then, the outputted scan data is latched by the third latch circuit 34 at the falling edge of the scan clock signal S2. In this manner, the second latch circuit 32 and the third latch circuit 34 function as a master latch circuit used for scanning and a slave latch circuit used for scanning, respectively. The scan circuit formed of the second latch circuit 32 and the third latch circuit 34 latches the scan data at the falling edge of the scan clock signal S1, and outputs the latched scan data to the scan data output terminal SO.

In the normal mode, the clock signal CLK is inputted instead of the scan clock signals S1 and S2. The input data D4 is latched by the first latch circuit 31 at the rising edge of the clock signal CLK. Then, the latched data D4 is outputted as a Q output to the data output terminal Q via the output selector 33 during the "H" level period of the clock signal CLK. Input data D5 that follows the data D4 is latched by the second latch circuit 32 at the falling edge of the clock signal CLK. Then, the latched data D5 is outputted as a Q output to the data output terminal Q via the output selector 33 during the "L" level period of the cock signal CLK. In this manner, in the normal mode, the flip flop 26 functions as a DDR type flip flop.

As described above, in the second embodiment, from among the two latch circuits 31 and 32 configuring a DDR flip flop, the latch circuit 32 is constructed to be compatible with a master latch used for scanning as well as a latch used for input data, thus making it possible to achieve both of the scan operation and the DDR flip flop operation with a minimum increased number of elements. The latch circuit 31 may be compatible with a master latch used for scanning.

In the foregoing description, the leading edge of the clock signal CLK is defined as a rising edge, and a trailing edge of the clock signal CLK is defined as a falling edge. Conversely, the leading edge of the clock signal CLK may be defined as a falling edge, and the trailing edge of the clock signal CLK may be defined as a rising edge. In this case, the "L" level should be read as the "H" level, and the "H" level should be read as the "L" level.

In the flip flop circuit configuration according to the second embodiment, it becomes possible to reduce a signal delay more remarkably as compared with the flip flop circuit configuration according to the first embodiment shown in FIG. 2, since the input selector 24 is not interposed between the data input terminal D and the data output terminal Q. Further, a high speed operation can be achieved.

Furthermore, like the flip flop (FIG. 6) of the first embodiment, the output selector 33 may be made of three NAND gates. The clocked inverters 211, 218, 222, etc. may be made of transfer gates.

Moreover, it is possible to mount the flip flop 11 according to the first embodiment and the flip flop 26 according to the second embodiment together on a common LSI. In this case, the flip flop 26 according to the second embodiment can be used for a section required for a higher speed operation, and the flip flop 11 according to the first embodiment can be used for a section at which reduction of a circuit area precedes a high speed operation. In both of the flip flips 11 and 26, at least a master latch circuit used for scanning is realized by employing one of the two latch circuits used for the DDR flip flop, thus making it possible to reduce the number of elements.

According the embodiments of the present invention, it becomes possible to achieve a scan function and a flip flop operation having a speed which is higher than a frequency of a clock signal with a small number of elements.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus comprising:
   a data input terminal;
   a data output terminal;
   a clock input terminal;
   a scan data input terminal;
   a first latch circuit which latches an input data inputted to the data input terminal at a leading edge of a clock signal inputted to the clock input terminal;
   a second latch circuit which latches the input data at a trailing edge of the clock signal;
   a selector which, during a period from the leading edge to the trailing edge of the clock signal, selects an output data from the first latch circuit to output a selected output data to the data output terminal, and, during a period of the trailing edge to a next leading edge of the clock signal, selects an output data from the second latch circuit to output a selected output data to the data output terminal; and
   a scan data output terminal which outputs an output data from the second latch circuit;
   a circuit which outputs the input data inputted to the data input terminal to the first latch circuit during a normal mode and outputs a scan data inputted to the scan data output terminal to the first latch circuit during a scan mode; and
   a circuit which outputs the input data inputted to the data input terminal to the second latch circuit during the normal mode and outputs the output data from the first latch circuit to the second latch circuit during the scan mode.

2. An apparatus according to claim 1, wherein the leading edge of the clock signal is a rising edge of the clock signal, and the trailing edge of the clock signal is a falling edge of the clock signal.

3. An apparatus according to claim 1, wherein the leading edge of the clock signal is a falling edge of the clock signal, and the trailing edge of the clock signal is a rising edge of the clock signal.

4. An apparatus according to claim 1, wherein the flip flop is of double data rate type which operates at a rate of two times the frequency of the clock signal.

5. An apparatus comprising:
   a data input terminal;
   a data output terminal;
   a clock input terminal;
   a scan data input terminal;
   a scan data output terminal;
   a first latch circuit which latches an input data inputted to the data input terminal at a leading edge of a clock signal inputted to the clock input terminal;
   a second latch circuit which, during a normal mode, latches the input data at a trailing edge of the clock signal, and, during a scan mode, latches a scan data inputted to the scan data input terminal in synchronism with a first scan clock signal inputted during the scan mode;
   a selector which, during a period from the leading edge to the trailing edge of the clock signal, selects an output data from the first latch circuit to output a selected output data to the data output terminal, and, during a period of the trailing edge to a next leading edge of the clock signal, selects an output data from the second latch circuit to output a selected output data to the data output terminal; and
   a third latch circuit which, during the scan mode, latches the output data from the second latch circuit in synchronism with a second scan clock signal to output the latched output data to the scan data output terminal.

6. An apparatus according to claim 5, wherein
   the leading edge of the clock signal is a rising edge of the clock signal, and the trailing edge of the clock signal is a falling edge of the clock signal.

7. An apparatus according to claim 5, wherein the leading edge of the clock signal is a falling edge of the clock signal, and the trailing edge of the clock signal is a rising edge of the clock signal.

8. An apparatus according to claim 5, wherein the flip flop is of double data rate type which operates at a rate of two times the frequency of the clock signal.

* * * * *